United States Patent [19]

Blanchard

[11] Patent Number: 4,794,436
[45] Date of Patent: Dec. 27, 1988

[54] HIGH VOLTAGE DRIFTED-DRAIN MOS TRANSISTOR

[75] Inventor: Richard A. Blanchard, Los Altos, Calif.

[73] Assignee: Siliconix Incorporated, Santa Clara, Calif.

[21] Appl. No.: 195,436

[22] Filed: May 16, 1988

Related U.S. Application Data

[63] Continuation of Ser. No. 929,028, Nov. 10, 1986, abandoned.

[51] Int. Cl.$^4$ ............... H01L 29/78; H01L 27/02; H01L 29/72
[52] U.S. Cl. ................... 357/23.8; 357/43; 357/35
[58] Field of Search ............ 357/23.8, 43, 35

[56] References Cited

U.S. PATENT DOCUMENTS 4,669,177 6/1987 D'Arrigo et al. ............ 357/35

FOREIGN PATENT DOCUMENTS 56-38867 4/1981 Japan ................ 357/23.8

Primary Examiner—Martin H. Edlow
Assistant Examiner—Robert P. Limanek
Attorney, Agent, or Firm—Brian D. Ogonowsky; Alan H. MacPherson; Paul J. Winters

[57] ABSTRACT

A heavily doped P region is formed at the end of a lightly doped P− drain extension adjacent to the channel of a P channel MOS transistor. If the PMOS transistor is fabricated in an N-well surrounded by P− type material, a parasitic vertical transistor is formed which may be undesireably biased into its active mode if the voltage at the P+ drain of the PMOS transistor causes the P+ drain and N− body to be forward biased. When this vertical transistor conducts, power is wasted. The addition of the P region formed at the end of the lightly doped drain greatly increases the current gain of the parasitic lateral transistor, which is biased into its active mode under the same conditions which bias the vertical transistor into its active mode. The current through the lateral parasitic transistor, which may be recaptured, is thus much greater than the current through the vertical parasitic transistor, resulting in less power loss when the parasitic transistors are biased into their active modes under abnormal conditions.

8 Claims, 2 Drawing Sheets

HIGH VOLTAGE DRIFTED-DRAIN MOS TRANSISTOR

BACKGROUND OF THE INVENTION

1. Field of the Invention

This invention relates to a metal-oxide-semiconductor (MOS) transistor and in particular to a drifted-drain MOS transistor suitable for high voltage operation.

2. Description of the Prior Art

MOS transistors are devices consisting of diffused source and drain regions on either side of a P or N channel region, and a gate electrode insulated from the channel by silicon oxide. In some instances, the gate dielectric may be a sandwich such as $SiO_2/Si_3N_4$. When the proper control voltage is applied to the gate, the "channel" is accumulated, allowing carriers to flow between the source and the drain. A conventional P channel MOS transistor is illustrated in FIG. 1, by way of example. The transistor is formed with an N type substrate, having two P regions adjacent to the source and drain with a gate electrode interposed between the source and drain. The body region is contacted with an N+ region.

Integrated circuits which operate at relatively high voltages generally require MOS transistors that are capable of withstanding the full operating voltage of the circuit. Conventional MOS structures of the P channel or N channel type generally are not capable of sustaining high voltage operation and are subject to breakdown when high voltages are applied. The breakdown voltage is limited by field plate induced breakdown or by planar junction breakdown. The field plate induced breakdown occurs when the maximum breakdown voltage is exceeded at a junction in the vicinity of a biased gate of the MOS transistor. This maximum breakdown voltage is determined by the distance between the gate electrode and the drain, and the dopant profile of the drain junction. The planar junction breakdown is determined by the radius of curvature of the drain junction and the dopant concentration of the substrate. Breakdown occurs when the electric field in the vicinity of the junction exceeds the critical field of silicon.

One major objective of the semiconductor technology is to develop a transistor having a significant increase in the level of breakdown voltage. One type of transistor that can be adapted for this purpose is the drifted-drain MOS transistor, delineated in FIG. 2a. The drifted-drain MOS P— channel transistor is characterized by a lightly doped P— region that extends from the contacted drain region to the gate, thereby providing a conduction path from the region below the gate, which is inverted when the transistor is biased ON, to the P+ drain region. The P— region does not decrease the breakdown voltage of the device because the dopant concentration is kept sufficiently low. When a large reverse bias appears at the junction, this P— region depletes, thus increasing the breakdown voltage that is normally set by the radius of curvature of the P+ region. One characteristic of the drifted-drain MOS transistor is the bipolar current gain of the lateral PNP transistor which is formed when the drain region is biased as the emitter, the body region is biased as the base, and the source region is biased as the collector. With this type of configuration, the bipolar performance is limited by the ability of the lightly doped P— region to supply carriers, which is known as the emitter injection efficiency. This characteristic is largely determined by the relative concentrations of the "emitter" and the "base" regions. If the high voltage drifted-drain PMOS transistor of FIG. 2a is surrounded by a P— type region as shown in FIG. 2b, the current gain of the vertical PNP formed by using drain region 16 as the emitter, body region 28 as the base, and P— type region 30 as the collector may be higher than the lateral PNP formed by the drain (emitter), body (base), and source (collector) regions as described above. In certain circuit configurations, this vertical PNP action can be detrimental to its functioning.

SUMMARY OF THE INVENTION

An object of this invention is to provide an MOS drifted-drain transistor having a high breakdown voltage characteristic when a large reverse bias is applied to the drain junction and a high lateral PNP current gain when the drain junction is forward biased.

In accordance with this invention, a drifted-drain MOS transistor comprises a source region, a drain region, and a gate electrode. A lightly doped P— region connects a P+ region adjacent to the gate with a P+ region that contacts the drain. The carriers in the connecting P— region are depleted when a large reverse bias is applied at the PN junction, thereby decoupling the P+ regions. As a result, the breakdown voltage is increased, and the magnitude of the breakdown is dependent upon the relative concentrations of the P and N type regions and the distance between the two P+ regions of the drain.

BRIEF DESCRIPTION OF THE DRAWING

The invention will be described with the reference to the drawing in which.

Similar numerals refer to similar elements throughout the drawing.

DESCRIPTION OF THE PREFERRED EMBODIMENT

Although the description in this application is directed to a P channel MOS transistor, it should be understood that the invention is equally applicable to N channel MOS devices.

Figure 1:
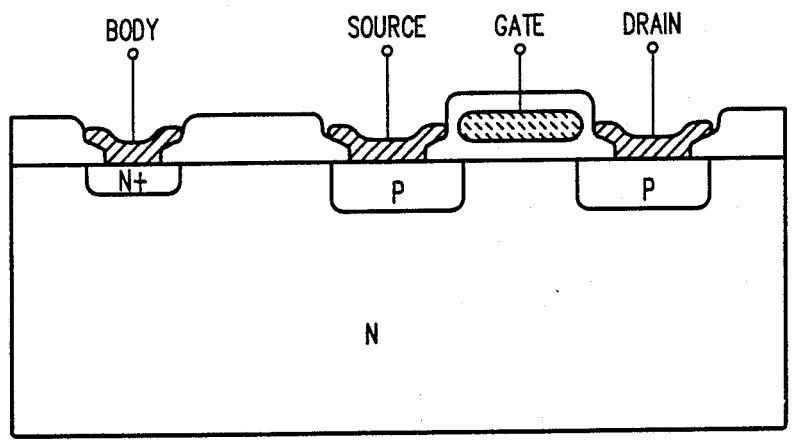
FIG. 1 is a cross-sectional view of a conventional P channel MOS transistor.
Figure 2A:
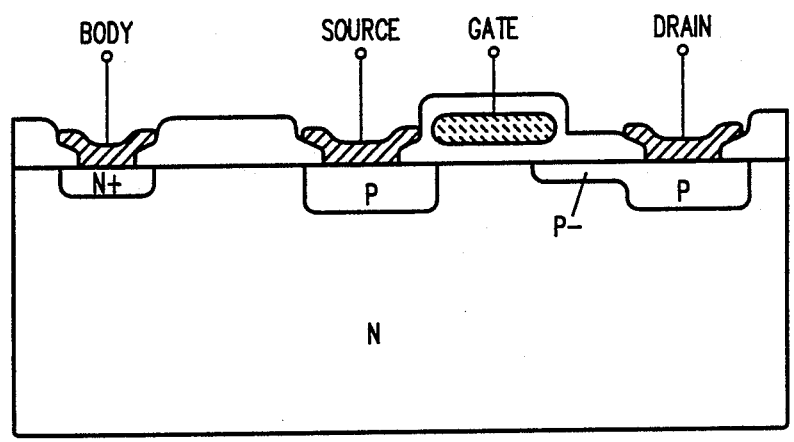
FIGS. 2a and 2b are cross-sectional views of prior art high voltage drifted-drain P channel MOS transistors, with and without a surrounding P— type region respectively.
Figure 2B:
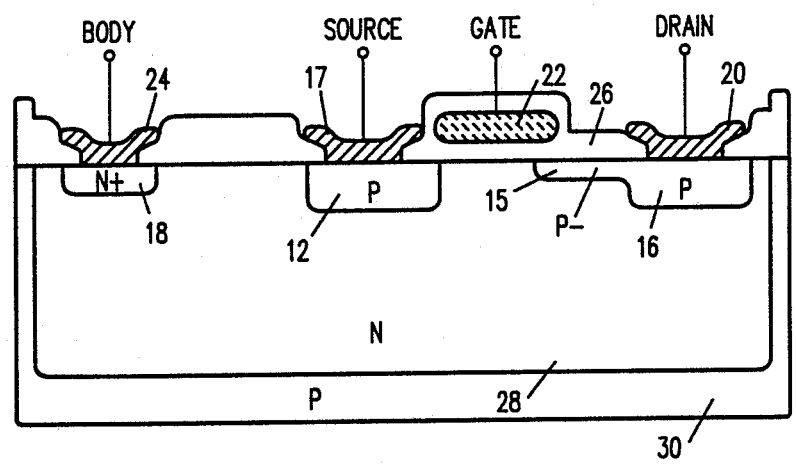
Figure 3:
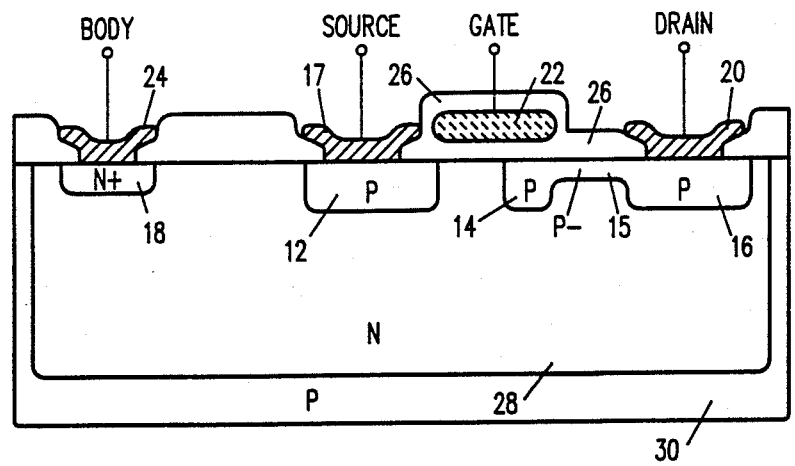
FIG. 3 is a cross-sectional view of a high voltage drifted-drain P— channel MOS transistor, made in accordance with this invention.

As illustrated in FIG. 3, a high voltage drifted-drain P channel MOS transistor is formed in an N type silicon substrate 10 having spaced P conductivity regions 12, 14, and 16. The P regions are produced by diffusion or ion implantation, by well known masking and photolithographic techniques. A dopant, such as boron is introduced into the major surface of the substrate 10, as is well known in the art to form the P conductivity regions. A heavily diffused N+ region 18 is formed in an area spaced from the P conductivity regions by diffusing a dopant, such as phosphorous or arsenic, into the major surface of the substrate 10.

The transistor structure is formed with a source metallization 17 above the P region 12, a drain metallization 20 disposed above the P region 16, and a gate electrode 22 formed between the source and drain. A body metallization 24 is deposited over the N+ region 18. Dielectric or insulating material 26 is laid down or grown around the gate electrode and between the source, drain and body regions.

In keeping with this invention, a resistor is formed by a lightly doped P− region 15 that connects the P regions 14 and 16. The P− region depletes when a large reverse bias is applied to the PN junction, so that the breakdown voltage that is normally set by the radius of curvature of the P+ region is increased. With a sufficiently large body-to-drain bias, the P− region is totally depleted thereby electrically decoupling the P+ regions 14 and 16. The breakdown voltage is determined by the relative concentrations of the P and N type regions and the distance between the P+ regions 14 and 16 associated with the drain.

In the embodiment of FIG. 3, the PMOS transistor is illustrated having an N well 28 that is encompassed by an extended P conductivity region 30. The vertical PNP structure, which is formed by the P+ drain region that serves as an emitter, the N type body region which serves as the base, and the P type substrate that serves as the collector, tends to divert current from the intended path through the lateral PNP transistor. However, the relative doping concentrations and the lateral dimensions of the regions of the transistor serve to effectively reduce the vertical PNP current gain while increasing the lateral PNP current gain.

Figure 4A:
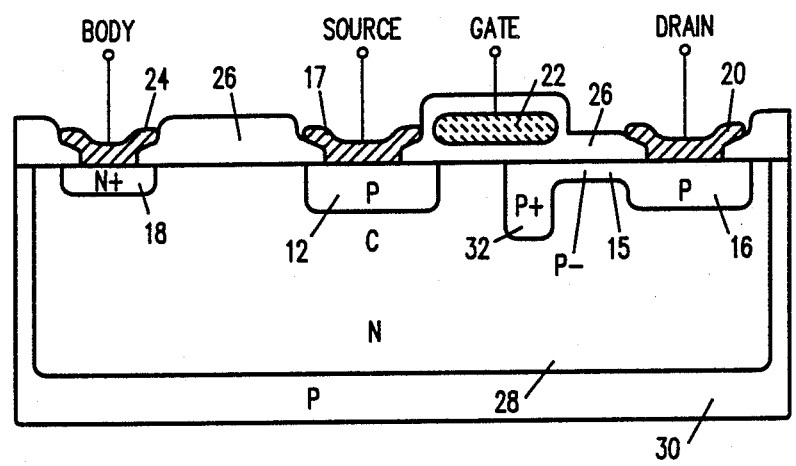
FIGS. 4a and 4b illustrate variations of the embodiment of FIG. 3.
Figure 4B:
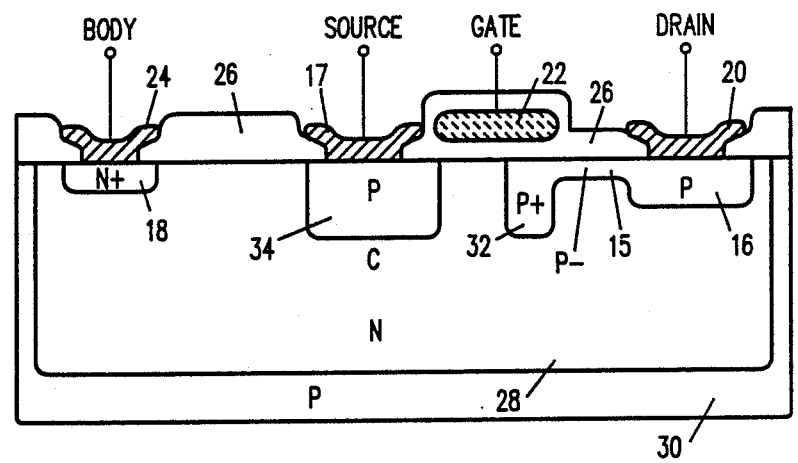

FIG. 4a depicts a PMOS structure of the type shown in FIG. 3, wherein a heavily doped emitter 32 is used. FIG. 4b illustrates a similar structure, with a heavily doped collector 34 and emitter 32 of the lateral PNP transistor. The structure is formed with a lightly doped drain contact diffusion on the emitter 16 of the parasitic vertical PNP transistor. The lightly doped P− region that connects the P+ region adjacent to the gate to the P+ drain contact region depletes to increase the breakdown voltage.

What is claimed is:

1. A high-voltage drifted-drain MOS transistor comprising:
   a P type substrate having a top surface;
   an N type body region formed on and below said top surface of said substrate, said body region having a top surface;
   a P type drain region formed on and below said top surface of said body region;
   a P type source region formed on and below said top surface of said N type body region;
   a P type first region formed on and below said top surface of said N type body region adjacent a channel region;
   a lightly doped P− type second region formed between and connecting said P type drain region and said P type first region;
   a gate electrode insulated from and formed over said channel region between said P type source region and said P type first region;
   a source metallization on said top surface of said body region above said source region; and
   a drain metallization on said top surface of said body region above said drain region.

2. A drifted-drain MOS transistor as in claim 1, including an N+ region spaced from said source region and formed on and below said top surface of said body region and a body metallization formed over said N+ region.

3. A drifted-drain MOS transistor as in claim 1, wherein said P type first region is heavily doped.

4. A drifted-drain MOS transistor as in claim 1, wherein said P type source region is heavily doped.

5. A high-voltage drifted-drain MOS transistor comprising:
   an N type substrate having a top surface;
   a P type body region formed on and below said top surface of said substrate, said body region having a top surface;
   an N type drain region formed on and below said top surface of said body region;
   an N type source region formed on and below said top surface of said P type body region;
   An N type first region formed on and below said top surface of said P type body region adjacent a channel region;
   a lightly doped N− type second region formed between and connecting said N type drain region and said N type first region;
   a gate electrode insulated from and formed over said channel region between said N type source region and said N type first region;
   a source metallization on said top surface of said body region above said source region; and
   a drain metallization on said top surface of said body region above said drain region.

6. A drifted-drain MOS transistor as in claim 5, including a P+ region spaced from said source region and formed on and below said top surface of said body region and a body metallization formed over said P+ region.

7. A drifted-drain MOS transistor as in claim 5, wherein said N type first region is heavily doped.

8. A drifted-drain MOS transistor as in claim 5, wherein said N type source region is heavily doped.

* * * * *